United States Patent [19]
Tanaka

[11] Patent Number: 5,249,016
[45] Date of Patent: Sep. 28, 1993

[54] SEMICONDUCTOR DEVICE MANUFACTURING SYSTEM

[75] Inventor: Hiroshi Tanaka, Yokohama, Japan

[73] Assignee: Canon Kabushiki Kaisha, Tokyo, Japan

[21] Appl. No.: 987,247

[22] Filed: Dec. 7, 1992

Related U.S. Application Data

[63] Continuation of Ser. No. 627,737, Dec. 14, 1990, abandoned.

[30] Foreign Application Priority Data

Dec. 15, 1989 [JP] Japan .................. 1-323969

[51] Int. Cl.$^5$ ............................................ G03B 27/42
[52] U.S. Cl. ...................................................... 355/53
[58] Field of Search .................. 355/43, 45, 53, 77; 250/548; 356/400, 401

[56] References Cited

U.S. PATENT DOCUMENTS

| | | | |
|---|---|---|---|
| 4,487,653 | 12/1984 | Hatcher | 156/644 |
| 4,725,517 | 2/1988 | Nakaowatari et al. | 430/20 |
| 4,741,622 | 5/1988 | Suwa et al. | 356/401 |
| 4,769,523 | 9/1988 | Tanimoto et al. | 356/400 X |
| 4,780,617 | 10/1988 | Umatate et al. | 250/548 |
| 4,803,524 | 2/1989 | Ohno et al. | 355/53 |
| 4,870,452 | 9/1989 | Tanimoto et al. | 355/53 |
| 4,874,954 | 10/1989 | Takahashi et al. | 250/548 |
| 4,962,423 | 10/1990 | Yamada et al. | 358/101 |
| 5,005,046 | 4/1991 | Hashimoto | 355/77 |
| 5,138,176 | 8/1992 | Nishi | 250/548 |
| 5,140,366 | 8/1992 | Shiozawa et al. | 355/53 |
| 5,144,363 | 9/1992 | Wittekoek et al. | 355/53 |
| 5,148,214 | 9/1992 | Ohta et al. | 355/43 |
| 5,177,528 | 1/1993 | Koromegawa et al. | 355/53 |

FOREIGN PATENT DOCUMENTS 59-27525  2/1984  Japan .
61-114529 6/1986  Japan .
63-232321 9/1988  Japan .

*Primary Examiner*—Richard A. Wintercorn
*Attorney, Agent, or Firm*—Fitzpatrick, Cella, Harper & Scinto

[57] ABSTRACT

A semiconductor device manufacturing system includes a resist coating unit for applying a photoresist to a wafer having different shot areas in each of which an alignment mark and a deviation measuring mark are formed and an exposure unit for exposing the photoresist in each shot area of the wafer to an exposure beam passed through a reticle having a deviation measuring mark. The exposure unit includes a detector for detecting, with respect to each shot area, a positional error of the wafer to the reticle by using the alignment mark, a stage for adjusting the positional relationship between the reticle and the wafer on the basis of the detection and an exposure system for exposing the wafer to the exposure beam passed through the reticle, to thereby print the deviation measuring mark of the reticle to the photoresist on each shot area of the wafer. The manufacturing system further includes a developing unit for developing the exposed photoresist, a conveying unit for conveying the developed wafer again into the exposure unit, and a control unit. The control unit causes the detector to detect, with respect to each shot area, a deviation between the deviation measuring mark of the wafer and the deviation measuring mark of the reticle as photoprinted on the photoresist of the wafer. The control unit also calculates a precision of alignment and/or an offset in the alignment between the reticle and the wafer based on the alignment mark.

8 Claims, 7 Drawing Sheets

FIG. 6A
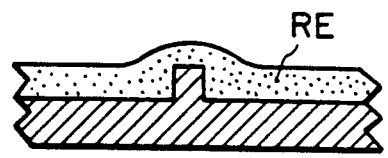
FIG. 6B
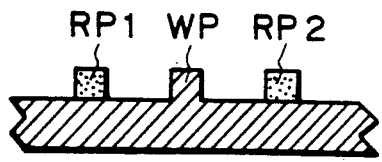
FIG. 6C
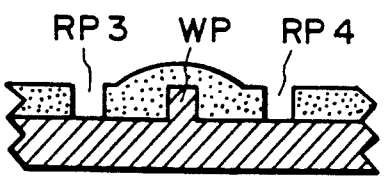
FIG. 6D
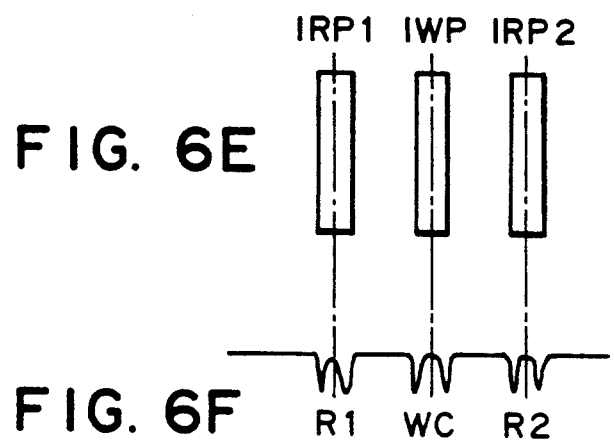
FIG. 6E
FIG. 6F
FIG. 6G
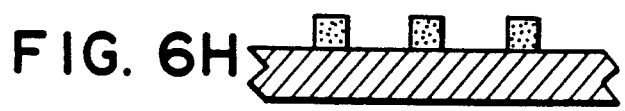
FIG. 6H
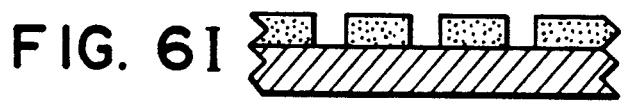
FIG. 6I

SEMICONDUCTOR DEVICE MANUFACTURING SYSTEM

This application is a continuation of prior application, Ser. No. 07/627,737 filed Dec. 14, 1990, now abandoned.

FIELD OF THE INVENTION AND RELATED ART

This invention relates to a semiconductor device manufacturing system which includes a resist coating apparatus, a semiconductor exposure apparatus and a developing apparatus to be used for the manufacture of semiconductor integrated circuits. More particularly, the invention is concerned with a semiconductor device manufacturing system wherein the precision of pattern superposition through the printing by a semiconductor exposure apparatus can be measured automatically.

Conventionally, in semiconductor device manufacturing processes, more particularly, in the pattern exposure process, a wafer having been processed by etching is brought into alignment with a pattern of a reticle and, thereafter, the pattern of the reticle is superposedly printed on the wafer. For measurement of a superposition precision and an offset error, a misregistration measuring pattern (vernier) is formed on the wafer, and the vernier is inspected through visual observation by an inspection operator, using a microscope or the like.

Further, for the inspection, usually a first one or two wafers, each being called a "leading wafer", of each lot (including several tens or several hundreds of wafers) are used. As for the inspection using such a leading wafer, all the visual observation inspecting operations are made by the operator with respect to the resist coating, the exposure and the development. After discrimination of the results of the inspection, the results are inputted to the exposure apparatus and the remaining wafers are sent to the manufacturing process line.

SUMMARY OF THE INVENTION

However, the inspection based on visual observation requires a long time and, as a result, the manufacturing line has to be stopped for a long time, thus decreasing the manufacturing efficiency. Also, with the increasing quantity of inspection, measurement errors are caused due to the fatigue of the operator. Further, if the inspection operator is changed by another, there may be a large difference in the result of visual observation inspection. Here, it is to be noted that, in the current LSI manufacturing technique, even a small error of 0.05 micron in the result of inspection and the resultant input of an incorrect value to the exposure apparatus as a process offset will cause degraded yield. Namely, the current inspection method involves a possibility of degradation of the inspection efficiency and the inspection precision, with respect to the control of the process offset and the alignment precision for each wafer process in the semiconductor device manufacture. In consideration thereof, a high-speed inspection apparatus having a stable measurement precision is desired.

In order to avoid the inconveniences involved in the visual observation inspection, a separate special inspection apparatus capable of measuring misregistration automatically, may be introduced. Currently, such as inspection apparatus is disposed independently of a semiconductor exposure apparatus and off-line controlled. A wafer having been exposed with the semiconductor exposure apparatus is brought by the operator, after development, into the inspection apparatus for automatic measurement. On the other hand, in order to assure that the process offset is controlled at a precision of 0.05 micron or higher, for example, the state of adjustment of an individual exposure apparatus has to be considered. An example of this is the correction of the base line in the off-axis alignment process. In order to compensate for a change in the base line with time, it is necessary to measure the offset quickly. Further, in order to attain a high precision of 0.05 micron order or higher, a measured value itself obtained with the exposure apparatus at the moment of the printing of the leading wafer has to be considered.

In many cases, during a period in which an offset input value is actually measured and is fed back to an exposure apparatus, the exposure apparatus itself is not usable and is kept in the waiting state. But, also in many cases, the exposure apparatus is equipped with a high-precision measuring mechanism for executing the alignment process.

The present invention has taken a special note to this point, and proposes utilization of a detecting mechanism of the exposure apparatus itself to attain high-speed and high-precision detection of the offset value.

In accordance with an aspect of the present invention, to achieve this object, there is provided a semiconductor device manufacturing system which includes a resist coating apparatus, a reduction projection exposure apparatus and a developing apparatus, wherein the reduction projection exposure apparatus is equipped with deviation detecting means for detecting a predetermined mark on a wafer to determine the positional deviation of the wafer, wherein the resist coating apparatus is effective coat the wafer with a resist, wherein through the reduction projection exposure apparatus, a pattern of a reticle is printed on the wafer with successive alignment of each shot position of the wafer, and wherein the developing apparatus is effective to develop the printed wafer. With the present invention, the semiconductor device manufacturing system is equipped with conveying means for transferring each wafer between these apparatuses, and control means for on-line coupling and controlling this conveying means and the individual apparatuses. This control means is arranged so that, in the exposure operation, a misregistration measuring mark and a calibration mark provided on the reticle are printed simultaneously, together with the pattern of the reticle, upon the wafer through the reduction projection exposure apparatus. After the printed wafer is developed by the developing apparatus, the misregistration measuring mark and the calibration mark as transferred to the wafer are measured by using the deviation measuring means and, on the basis of the result of measurement, the alignment precision and the offset quantity are determined by calculation.

Further, preferably, the control means may be so arranged that, while changing the height position of the wafer through relative moving means, an imagewise data of the misregistration measuring mark is obtained through image pickup means and, based on this, the height position of the wafer is controlled to ensure that the information related to the alignment precision is obtainable with minimum defocus of the misregistration measuring mark.

In the present invention, by making the exposure apparatus and its peripheral apparatuses into a single combined structure, an enahanced speed and an enhanced precision of measurement of the process offset are attained. More specifically, in the present invention, a coater (resist applying apparatus) and a developing apparatus (developer) as well as a stepper (reduction projection exposure apparatus) having an exposure and inspection mechanism, are controlled in an on-line control manner, such that a collective inspection operation wherein a leading wafer (a wafer to be inspected) is fed from the coater to the stepper for exposure thereof and, after development by the developing apparatus, it is fed again to the stepper for measurement of the alignment precision, is automatically executed. The measured value is compared with the state of the stepper at the time of the exposure and is automatically set at a desired time in the control means as the offset. Further, since the measurement of misregistration is based on image processing, measurement with a minimum error is ensured.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 6A–6I are schematic views, respectively, illustrating the stepped structure of misregistration measuring marks used in the system of FIG. 1, as well as an image and a signal waveform of the marks.

DESCRIPTION OF THE PREFERRED EMBODIMENTS

Figure 1:
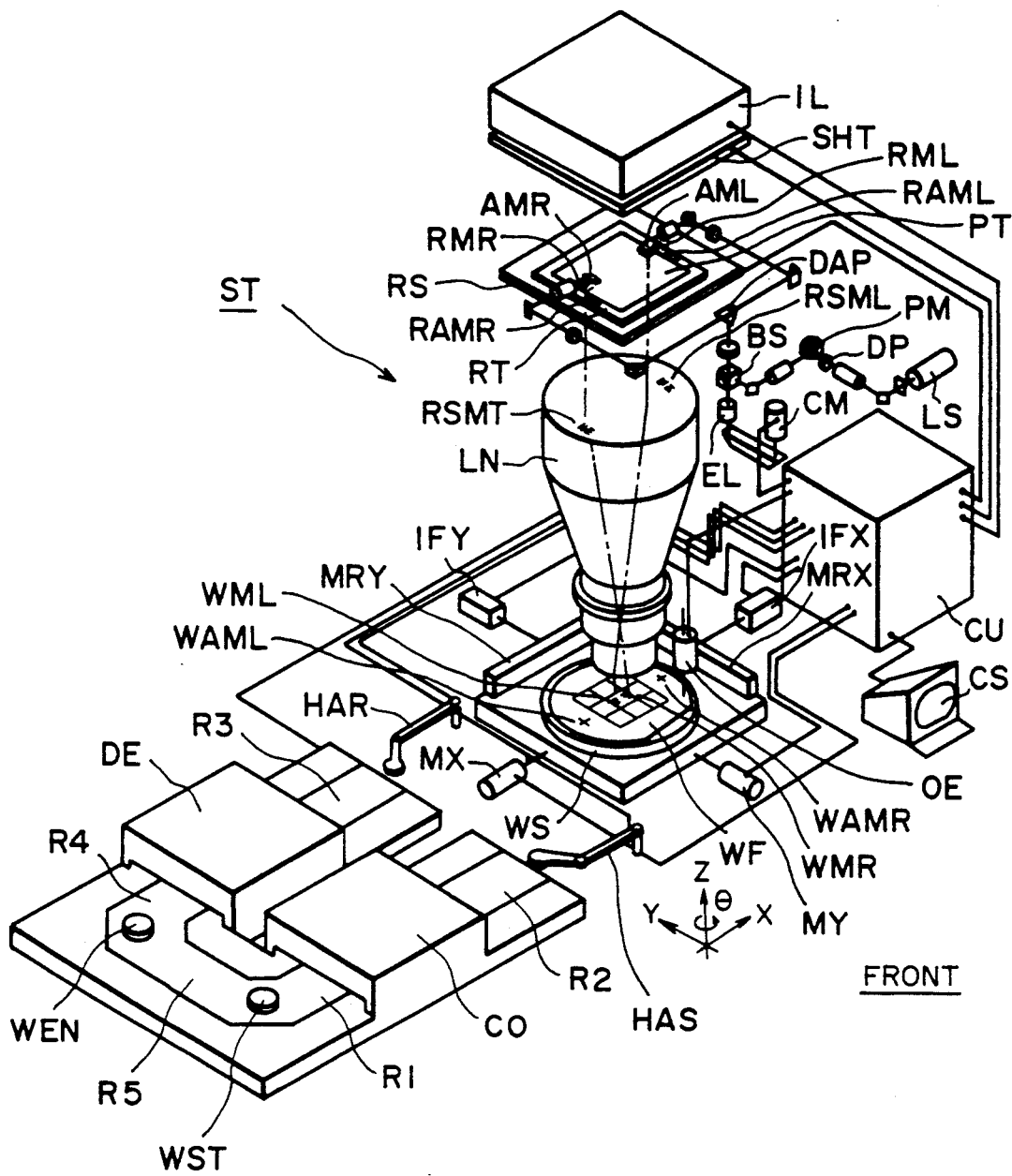
FIG. 1 is a perspective view, schematically showing a general structure of a semiconductor device manufacturing system according to an embodiment of the present invention, which includes a step-and-repeat type semiconductor exposure apparatus, a coater and a developer.

Referring first to FIG. 1, a semiconductor device manufacturing line (system) according to an embodiment of the present invention includes a coater CO, a stepper ST and a developer DE which are combined in series, for automatic inspection of the alignment precision and the offset error, upon exposure of a wafer WF.

Figure 4:
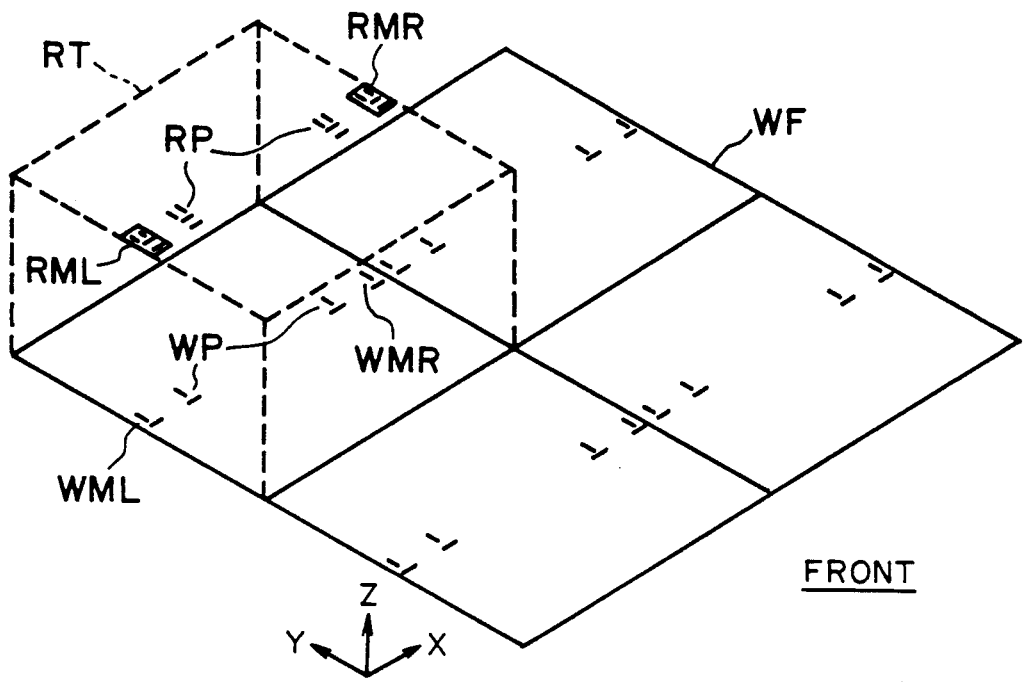
FIG. 4 is a schematic view, illustrating the positional relationship between a reticle and a wafer upon exposure of misregistration measuring marks in the system of FIG. 1.

The coater CO has a mechanism for applying a resist to a wafer which is going to be inspected (hereinafter, such a wafer will be referred to as a "test wafer"). The stepper ST is equipped with a mechanism for superposingly photoprinting a pattern of a reticle RT on the test wafer as well as a mechanism for measuring misregistration measuring marks WP (see FIG. 4) formed on the wafer. The developer DE has a mechanism for developing the test wafer having been subjected to the exposure process by the stepper ST.

The inspection is carried out automatically under the instructions from a control device CU, while transferring the test wafer placed at the entrance of the coater CO, between these mechanisms. The alignment precision and the process offset as calculated from the measured misregistrations, are inputted to the control device CU of the stepper ST and are used as alignment corrective values for product wafers. The test wafer is such a wafer having been subjected to the same manufacturing processes as those for manufacture of the product wafers, and it has formed thereon pre-alignment marks WAMR and WAML. Also, in each shot area thereof, the test wafer has formed alignment marks WMR and WML. These marks were printed on the wafer during the preceding step-and-repeat exposure process with the exposure apparatus of the present embodiment, using the preceding reticle different from the current reticle RT, by printing the pattern of the preceding reticle onto the wafer.

Figure 2:
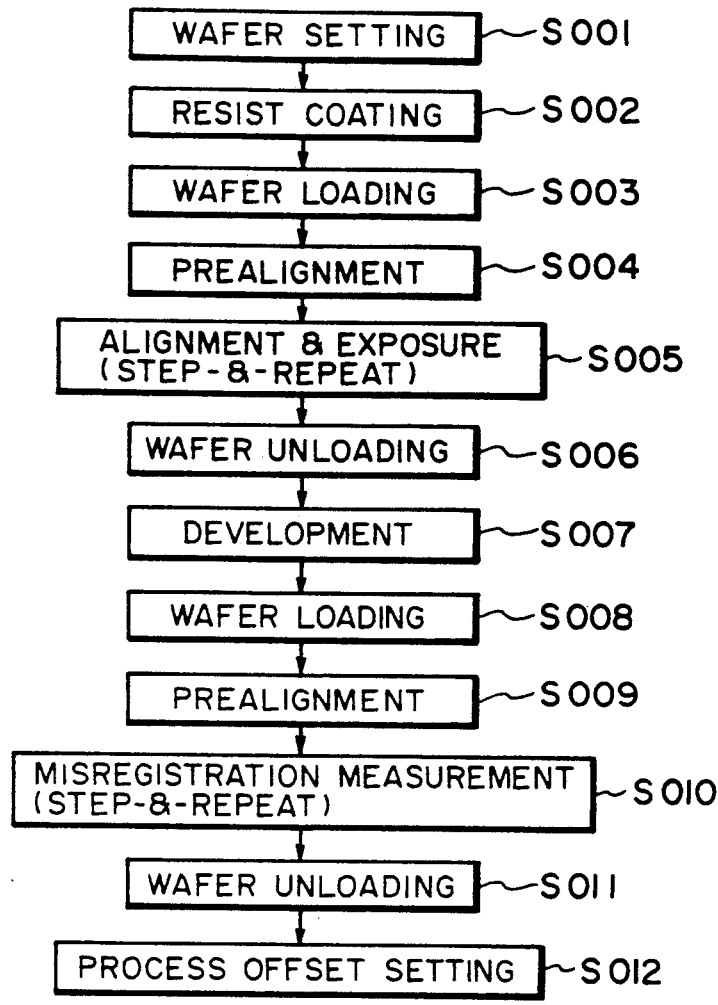
FIGS. 2 and 3 are flow charts, respectively, each explaining the sequence of automatic measurement in the system of FIG. 1.
Figure 3:
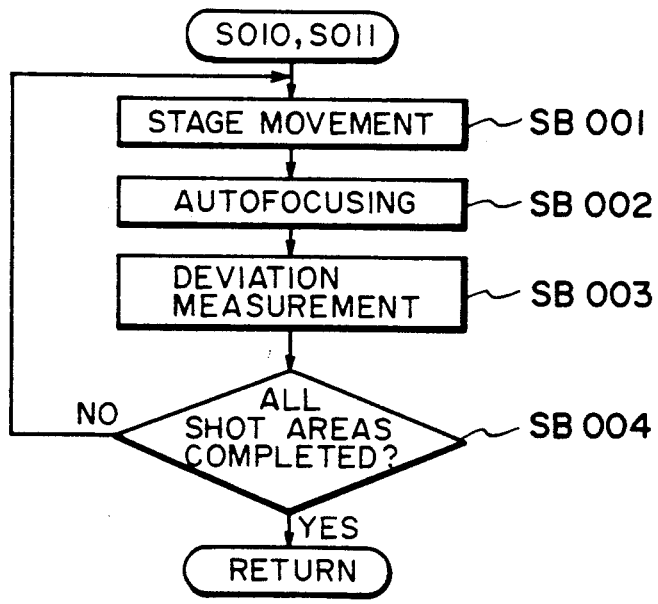

Referring to FIGS. 2 and 3 as well as FIG. 1, details of the automatic inspection procedure will be explained. It is to be noted here that the operations in the first to fourth steps to be described below are carried out under the control of the stepper control device CU, and that many varieties of instruments of the system are communicated with the stepper control device CU by communication cables as shown in FIG. 1, whereby the on-line control of these instruments is assured.

At the first step (blocks S001–S003), a wafer to be inspected is placed on a wafer setting table WST (S001). This wafer is conveyed along a conveying passage R1 to the resist coating device (coater) CO in which it is coated with a resist (S002). Then, it is conveyed along another conveying passage R2 to the stepper ST, wherein it is placed on a wafer chuck WS of an X-Y stage XYS by means of an automatic hand HAS and it is held by the wafer chuck with vacuum attraction (S003).

The second step (blocks S004–S006) is the step for photoprinting the pattern of the reticle RT on the wafer which is coated with a resist.

Here, the pattern region to be exposed by a single exposure is called a "shot area". The reticle RT disposed above a reduction projection lens LN has been aligned, by using setting marks RSML and RSMR formed at the top of the reduction projection lens LN as well as reticle alignment marks RAMR and RAML formed on the reticle RT. The position of the X-Y stage XYS is measured precisely by means of a combination of a laser interferometer IFX and a mirror MRX, with respect to an X-axis direction while, with respect to a Y-axis direction, it is measured precisely by means of a combination of another laser interferometer IFY and another mirror MRY. By controlling rotations of motors MX and MY, a desired position of the wafer can be moved to and placed of underneath of the reduction projection lens LN.

As regards the wafer held, through attraction, by the wafer chuck of the wafer stage WS, the positions of the marks WAML and WAMR of the wafer are measured through an off-axis optical system OE and, based on this, the X-Y stage XYS is moved in the manner described hereinbefore. By this, a desired position of the wafer can be placed at a predetermined initial position (S004).

Figure 7:
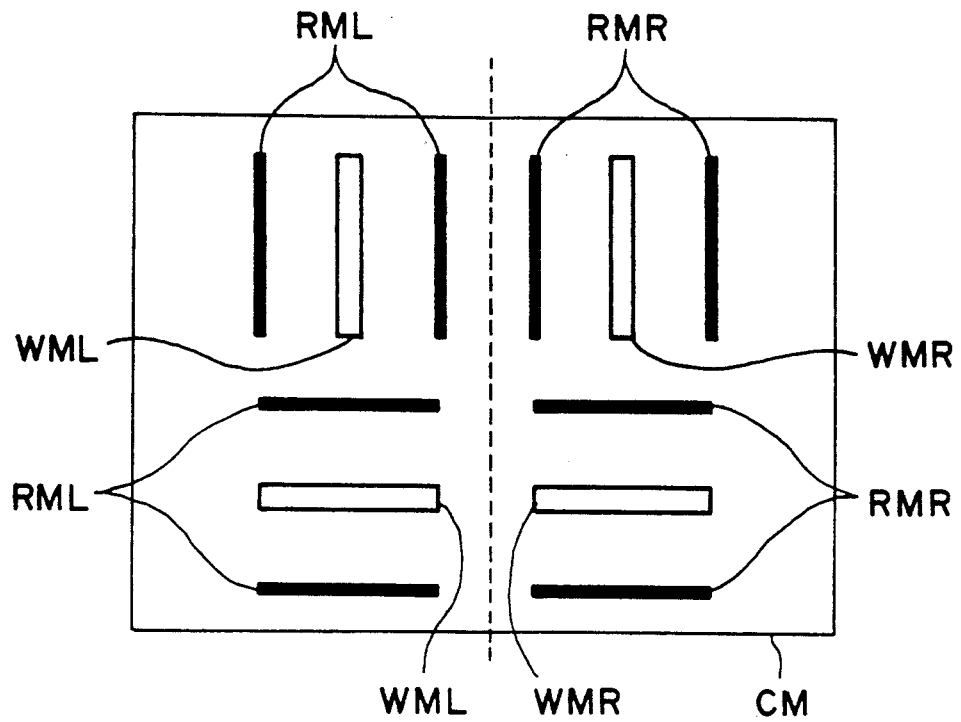
FIG. 7 is a schematic view, illustrating an image of alignment marks used in the system of FIG. 1.

Subsequently, the X-Y stage XYS is moved so that the first shot area is placed below the reduction projection lens LN, and the alignment operation is executed in the manner to be described. Namely, first, light of a wavelength substantially the same as that of the light used for the exposure (photoprinting) is projected from an alignment light source LS such as a He-Cd laser, and the projected light is diffused by a diffusion plate DP for reducing non-uniformness in illuminance. After this, the light is scanningly deflected by the polygonal mirror PM to expand the illumination range and, then, it is distributed by a prism DAP to a left side optical system and a right side optical system, respectively. The alignment light inputted to the left side optical system is projected by an objective mirror AML to illuminate the alignment mark RML of the reticle RT and, after this, it enters into the reduction projection lens LN and illuminates the alignment mark WML of the wafer. Thus, after reflection by the wafer WF, the light which now bears the imagewise information of the alignment mark WML goes through the projection lens LN and, after being reflected by a reflection mirror AML and together with an image of the alignment mark RML of the reticle RT, it goes to the prism DAP and is then expanded by an erector EL. Finally, it is imaged on a CCD camera CM. This is also true with the case of the light inputted to the right side alignment optical system having an objective mirror RMR. Thus, the alignment mark RMR of the reticle RT and the alignment mark WMR of the wafer WF are imaged on the CCD camera CM. FIG. 7 shows the alignment marks RML, RMR, WML and WMR of the wafer WF and the reticle RT, as imaged on the CCD camera CM in this manner.

Subsequently, the thus obtained image is processed in the stepper control device CU to calculate positional deviation (misregistration) between the wafer WF and the reticle RT with respect to the X, Y and θ (rotational) directions and, on the bases of the results of calculation, a reticle stage RS on which the reticle RT is held by attraction is displaced minutely in the X, Y and θ directions to accomplish the alignment between the reticle and the wafer. Simultaneously with the completion of alignment, an exposure shutter SHT for allowing the reticle IC pattern printing, is opened. In response, the light from an exposure light source IL impinging on the reticle pattern RT goes through the reduction production lens LN by which it is reduced to 1/5, and the thus reduced light impinges on and sensitizes a portion of the resist applied to the wafer WF surface. At this time, misregistration measuring marks (RP in FIG. 4) of the reticle, to be described later, are printed superposedly upon corresponding misregistration measuring marks (WP in FIG. 4) of the wafer. After completion of the exposure, the X-Y stage XYS is moved to a position to be exposed subsequently. The series of stage movement, alignment operation, exposure operation and stage movement as described hereinbefore are repeated, operation and the repeated is called "step-and-repeat" (S005). When the exposure of all the shot areas on the wafer WF are completed, the wafer is conveyed by a collection hand HAR from the wafer chuck to a conveying passage R3 for the developing apparatus, and the sequence goes to the third step (S006).

At the third step (S007), the wafer conveyed to the conveying passage R3 is fed into the developing apparatus DE and the developing process is executed (S007). After development, the wafer is fed along a conveying passage R4 into a conveying passage R5, and the sequence goes to the fourth step for inspection.

At the fourth step (S008–S012), the wafer is fed along the conveying passage R1, having been used at the first step, directly to the conveying passage R2, without resist coating by the coater CO, and it is placed again on the wafer chuck by means of the supply hand HAS (S008). Then, the position of the wafer is adjusted by using the off-axis optical system OE (S009). Here, the reticle-to-wafer alignment such as at the second step is not executed, but the alignment precision at the second step is inspected by using the misregistration inspecting mark WP provided on the wafer as well as the misregistration inspecting mark RP of the reticle RT as photoprinted on the wafer (S010).

More specifically, first, the objective mirrors AMR and AML are displaced to the positions of misregistration measuring windows WIL and WIR (FIG. 5) of the reticle. Each window has no pattern for alignment. The mark WPA (FIG. 5) as observed through the window is such as shown in FIG. 6E, for example, wherein it comprises a combination of the misregistration measuring mark WP of the wafer and the misregistration measuring mark RP of the reticle as transferred to the wafer WF. It is to be noted here that, in FIG. 6E, only the mark components in the X direction are illustrated, and that the mark elements in the Y direction have a similar configuration. The disposition and configuration of the mark WPA are the same as those of the set of the alignment marks RMR and WMR or those of the set of the marks RML and WML. Therefore, it does not need modification of the algorithm of the measuring process or modification of the optical arrangement. The method of mark measurement will be explained below.

Referring to FIG. 3, while moving the X-Y stage in the step-and-repeat manner, from the first shot area to the last shot area of the wafer WF (SB001), the images of the misregistration measuring marks are picked up by the CCD camera CM and the autofocus measurement based on the image processing is carried out. Then, the interval between the projection lens and the wafer WF placed on the stage WS is adjusted so that an optimum distance is set therebetween (SB002). Subsequently, on the basis of the image processing, measurement of the misregistration measuring marks WPA is executed and positional deviations between the mark WP and the mark RP transferred to the wafer WF with respect to the X, Y and θ directions are calculated (SB003). For each of the shot areas of the wafer WF, the results of the measurement obtained by calculation are memorized into the control device CU.

After measurement of the marks of each shot area, the wafer is unloaded from the wafer chuck by means of the collection hand HAR and is fed to the conveying passage R3 for the developing apparatus. In this developing apparatus DE, however, the developing process is not carried out, and the wafer is directly fed to the passage R4 and, at a wafer collection table WEN, the wafer is unloaded from the manufacturing system (S011).

Subsequently, the stepper control device CU calculates the automatic alignment precision (in this example, it corresponds to a triple "$3\sigma$" of the variance "$\sigma$" of the measured values) as well as the offset corresponding to an average of the measured values, on the basis of the measured values stored therein and related to the marks WPA (mark WP and mark RP transferred to the wafer) of each shot area. Then, the control device CU outputs the calculated values. Here, if the triple "$3\sigma$" is significantly larger than a predetermined tolerance, an alarm is outputted to a terminal CS for a warning to the operator. If the triple "$3\sigma$" is within the range of tolerance, it means that the process offset is detected correctly. The thus detected process offset is automatically set in the stepper control device CU (S012), together with the alignment measured values as measured by using the marks RMR, RML, WMR and WML, as corrective quantities for the drive of the reticle stage RS at the time of an alignment-operation for each shot area of each product wafer.

The automatic inspection procedure has been explained above. Next, the method of misregistration measuring mark formation will be explained, with reference to FIG. 6.

For a wafer to be inspected, measuring marks WP are formed on the wafer substrate, such as shown in FIG. 6A, during the preceding exposure process of the semiconductor device manufacturing processes. This mark forming method is the same as the alignment mark forming method. In the present embodiment, for formation of the marks WP, a certain reticle is used and set on the exposure apparatus ST. After the mark formation, this reticle is replaced by another and, thereafter, the wafer having the marks WP formed thereon is coated with a resist RE at the first step. This is illustrated in FIG. 6B. At the second step, the newly introduced reticle and the resist-coated wafer are aligned with each other, on the basis of the detection of the marks RMR, RML, WMR and WML through the CCD camera CM. Also, after such an alignment operation, the marks RP (FIG. 4) formed on the newly introduced reticle are transferred to the resist layer RE of the wafer. Then, as a result of development, the wafer has a sectional configuration such as shown in FIG. 6C or FIG. 6D, and the reticle marks RP are transferred as the marks RP1 and RP2 or the marks RP3 and PR4. The image as picked up by the CCD camera CM at the fourth step for the misregistration measurement, is such as shown in FIG. 6E and, when it is processed by the stepper control device CU, a signal having been compressed in the mark longitudinal direction, such as shown in FIG. 6F, is obtained.

Next, the manner of detecting the position of the thus formed mark as well as the method of calculating the misregistration, will be explained. FIG. 6F illustrates a signal which is compressed in the mark longitudinal direction. For the mark detection, first, the center of each of the three mark elements is determined independently of the others. Then, from the centers R1 and R2 of two reticle mark elements, the reticle mark center is determined in accordance with the following equation:

$$RC = (R1 + R2)/2$$

The quantity of deviation (misregistration) can be determined from this and from the wafer mark center WC, in the following manner:

$$E = RC - WC$$

As for the configuration of the mark to be detected, in the section of the wafer, there are two examples such as shown in FIGS. 6C and 6D. In the case when the mark WP is covered by a resist RE (FIG. 6D), because of the effect of interference due to the presence of the resist RE, the effect of non-symmetric application of the resist material and the like, an error easily occurs in the determination of the center position WC of the mark WP. Also, there is a problem that, with a decreasing depth of focus resulting from an increasing numerical aperture (NA) of a reduction production LN, it is not possible to obtain a large focus margin. For these reasons, it is desirable to adopt the sectional configuration such as shown in FIG. 6C, wherein surface steps or surface level differences of substantially the same magnitude are obtainable.

The process offset and the alignment precision as described hereinbefore are discriminated in accordance with the following equations:

$$M = \left[ \sum_{i=1}^{N} Ei \right]/N$$

$$\sigma = \sqrt{\left[ \sum_{i=1}^{M} (Ei - M)^2 \right]/(N-1)}$$

wherein N is the number of all the shot areas, $\Sigma$ is the quantity of positional deviation as measured, M is the offset and $\sigma$ is the variance of the alignment precision. The alignment evaluation of the inspected wafer is discriminated, by using a triple "$3\sigma$".

The value M is inputted to the stepper automatically as the alignment offset. While, in the foregoing, description has been made to a case where the reticle-to-wafer alignment is carried out at the second step, this is not a requirement for determination of the offset. It is a possible alternative that the measured positional deviation is memorized and the exposure is carried out without an alignment operation, wherein the memorized value is compared with the value measured automatically after the development. There is a case where, even after the alignment operation, an error is caused in the drive quantity. On that occasion, if the positional deviation is memorized and is compared with the value measured automatically after the development, it is possible to reduce the error in the correction of the offset.

Next, description will be made of a case wherein the present invention is applied to calibration of a measurement error, in global alignment measurement.

The global alignment method is a method according to which mark positions of some shot areas of a wafer, having been predetermined, are measured to determine the state of disposition of all the shot areas and, based on this, the exposures of these shot areas are carried out while moving an X-Y stage XYS successively to the positions of minimum misregistrations. In this alignment method, mainly, the rotational component and the magnification component of the state of disposition of the shot areas of a wafer are measured and, by using the measured values, the quantity of stepwise movement of the X-Y stage is corrected. This alignment method has an advantage in that, in the measured shot areas, a measured value which is considered as an extraordinary value can be excluded, and also in that due to the averaging effect resulting from the use of plural measured values, the measured values of the rotational and magnification components have high reliability. If the rotational component and the magnification component are measured precisely with this alignment method and the quantity of stepwise movement of the stage is corrected exactly, then the alignment error at the time of completion of the exposure can be reduced to approximately zero. If, to the contrary, an error occurs in the measurement of the quantity of stage movement, the alignment precision degrades. In such a case, however, the degradation of the precision appears as the rotational or magnification component.

In the automatic measurement, by measuring the quantity of misregistration of a test wafer aligned in accordance with the global alignment method, it is possible to detect the alignment error with respect to the rotational component and the magnification component. By using the thus detected alignment error, that is, the alignment correction error, it is possible to calibrate the corrective quantity of the stage movement in the global alignment operation.

Referring to the flow chart of FIG. 5, the automatic measurement procedure for calibration of a measurement error in the global alignment operation will be explained.

In a first step, like the preceding case, a wafer is coated with a resist and, then, it is fed into the stepper (S101-S104). At a second step, with regard to the measurement shot areas having been preset for the global alignment, measurement of alignment marks is carried out in a similar manner as described. By using measured values, the corrective quantity for the stepwise movement of the stage is calculated. More specifically, for this corrective quantity, an X-axis rotational component ROTx, a Y-axis rotational component ROTy, an X-axis magnification component MAGx and a Y-axis magnification component MAGy, are determined. These corrective quantities are memorized into the control device CU (S105). Further, while moving the X-Y stage stepwise by the amount as calculated in accordance with the corrective quantities, exposures of the shot areas are executed (S106). When the exposures of all the shot areas are completed, the wafer is conveyed to the developing apparatus DE (S107), and the developing process at a third step is carried out (S106). Subsequently, at a fourth step, the wafer is fed again into the stepper (S109) and, after execution of the pre-alignment operation (S110) for determination of the wafer position, automatic measurement of the alignment error (misregistration) is carried out (S111). Then, as a result of measurement, the process offset as well as the rotational and magnification components, determined as the alignment error, are inputted to the control device CU as global alignment calibration quantities (S113 and S114). Here, the calibration quantities to be inputted to the control device CU are the process offset M, a calibration quantity (ROTxc for the X-axis rotational component, a calibration quantity ROTyc for the Y-axis rotational component, a calibration quantity MAGxc for the X-axis magnification component and a calibration quantity MAGyc for the Y-axis magnification component. The remaining portion of this embodiment is substantially the same as the corresponding portion of the preceding embodiment.

The alignment and exposure process for the product wafers is carried out while correcting the quantity of stepwise movement of the stage in accordance with a value obtained by subtracting the calibration quantities having been inputted to the control device CU from the corrective quantity of stage movement as determined on the basis of the position measurement made to the deviation measurement shot areas of each product wafer. By doing so, it is possible to attain very high alignment precision.

Next, the autofocusing (AF) based on the image processing, will be explained.

For the autofocusing, the misregistration measuring mark is used, and no additional mark is used therefor. In order to obtain the optimum stage height, namely, the best focus, the degree of defocus of the image is detected and, for this purpose, an evaluation function for quantizing the defocus on the basis of contrast or the like is used as an example. The best focus position is determined in such a manner that: while displacing the X-Y stage in its height direction, images are picked up. Evaluated quantities of the evaluation function are plotted in the control device CU, and the highest one of the evaluated quantities is determined as the stage height. With the addition of the autofocusing mechanism, the precision of measurement of the misregistration measuring mark is improved and, thus, the stability of the process offset measurement is enhanced.

By using the inspection procedure of the present embodiment, as described hereinbefore, it is possible to execute self-inspection of a reduction projection exposure apparatus. Namely, with respect to the inspection of the X-Y stage and the evaluation of the reduction projection lens as well as the inspection of reticle rotation, all having been conducted by an inspection operator on the basis of vernier evaluation, all the steps of resist coating, exposure, development and inspection can be replaced by the automatic inspection procedure of the present invention.

Figure 9:
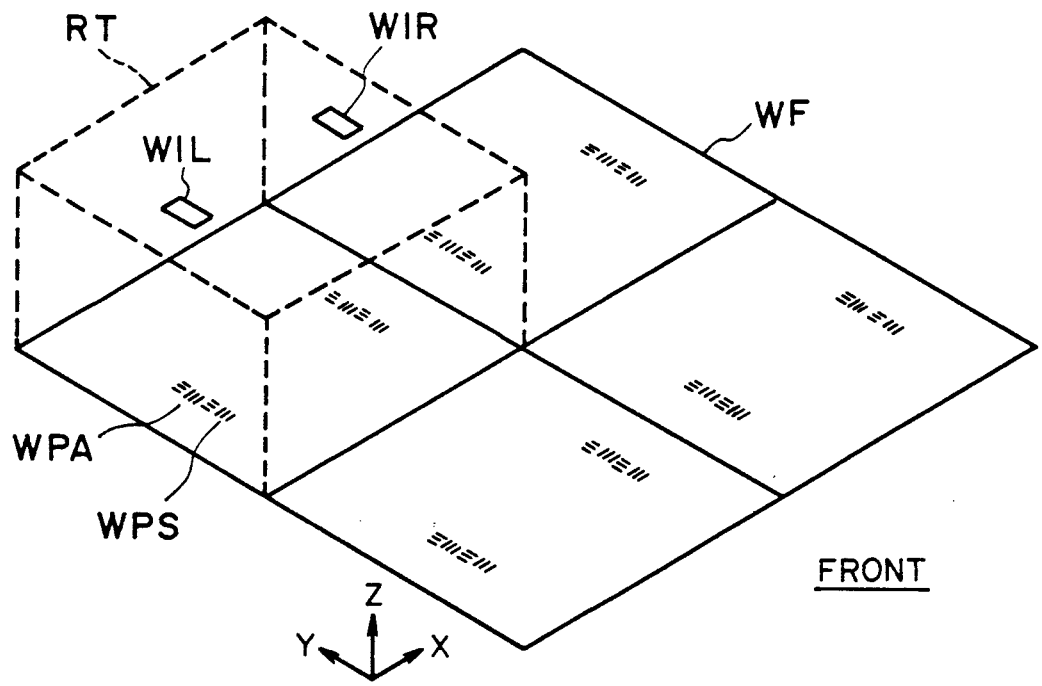
FIG. 9 is a schematic view, illustrating a positional relationship between a reticle and a wafer, upon calibration of a measured value, in the system of FIG. 1.

Referring now to FIG. 9, a method of calibrating a measured value itself obtained by measurement of the misregistration measuring mark will be explained.

The calibration of a measured value itself obtained by the automatic measurement of the misregistration measuring mark, is allowed by measuring those marks (calibration marks WPS) having been designed to define sero (0) deviation. It is desirable that the calibration mark is printed at the time of photoprinting of the misregistration measuring mark RP (FIG. 4) on a test wafer, at a position adjacent to the misregistration measuring mark WPA. This is because the conditions such as the state of resist coating, expansion or contraction of the shot area, and the like, are most analogous to those of the misregistration measuring mark. For measurement of the calibration marks WPS, the X-Y stage XYS is moved at the fourth step so as to allow the marks WPS to be observed through the mark measuring windows WIL and WIR of the reticle. The manner of measurement is the same as that of the measurement of the misregistration measuring mark, described hereinbefore. The result of measurement is processed in the control device CU, and an average MC is obtained in accordance with the following equation:

$$MC = \left[ \sum_{i=1}^{N} DC_i \right] / N$$

wherein DC is a measured value and N is the number of measured shot areas. The obtained quantity provides a calibration quantity. Accordingly, the process offset M in the misregistration measurement can be calibrated in accordance with the following equation:

$$Mof = M - MC$$

Figure 10:
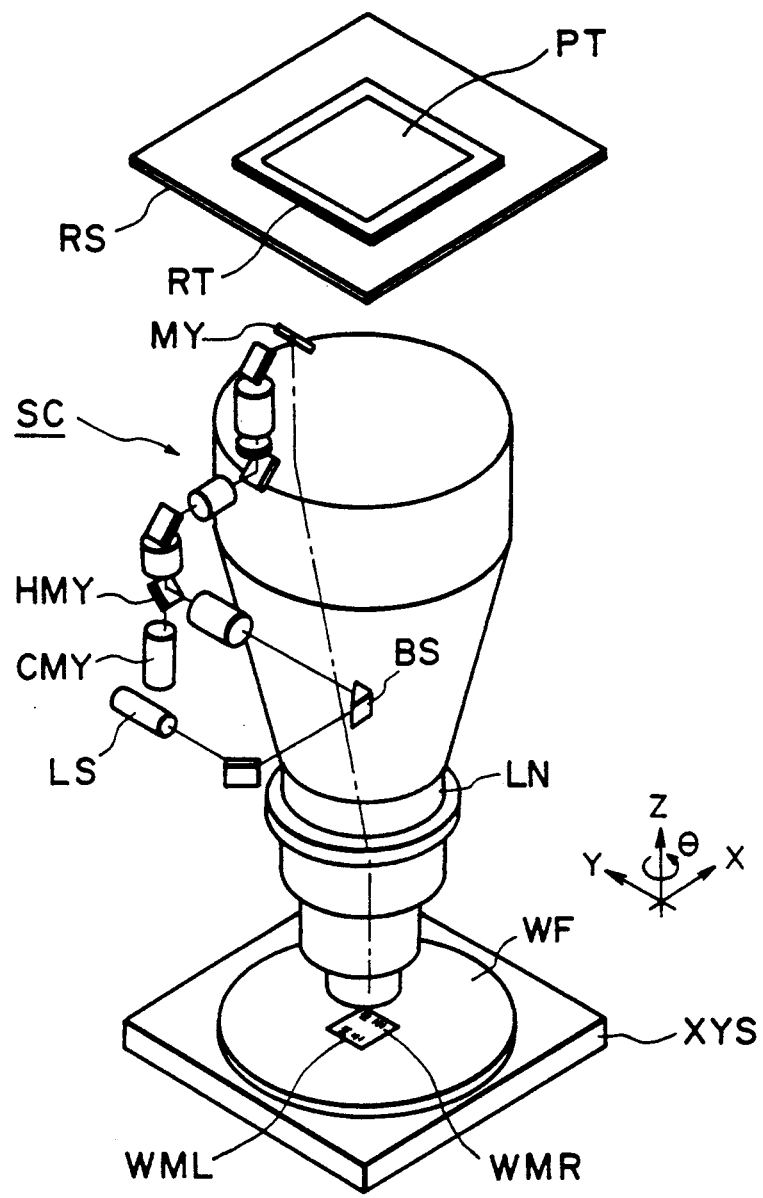
FIG. 10 is a perspective view, schematically illustrating a general structure of a stepper according to another embodiment of the present invention, wherein automatic measurement is attainable with a TTL (through-the-lens) scope, without using a reticle.

Referring to FIG. 10, description will be made of a semiconductor device manufacturing system wherein automatic measurement of the image of the misregistration measuring mark is attainable by using a TTL (through-the-lens) alignment mechanism, without through a reticle. The procedure from the first step to the third step can be conducted under the same concept as the preceding embodiment, and they are not described here. However, it is to be noted that, for measurement of the alignment mark at the second step, a TTL measuring mechanism shown in FIG. 10, to be described later may be used. On that occasion, the exposure is made on the basis of a global alignment method.

An alignment scope SC for measuring the misregistration measuring mark at the fourth step is held at a fixed position. A mirror MY for projecting alignment mark illuminating light to the reduction projection lens LN is set at such a position that does not block the exposure light with which a circuit pattern formed on the reticle RT is printed on the wafer WF.

The manner of picking up an image of the misregistration measuring mark by using the alignment scope SC, will be explained. Since the alignment mechanism is held fixed, the observation of the misregistration measuring mark is conducted only on the basis of the position control of the X-Y stage XYS on which a test wafer is placed. As an example, for observation of misregistration measuring marks WML and WMR of the same shot area, as shown in FIG. 10, the motion of the motor is controlled to move the stage XYS by a distance corresponding to the mark interval, such that the mark is brought to the position below the scope. A laser light source LS emits a mark illuminating laser light. It is directed via optical element BS, HMY and MY, and it impinges on the projection lens LN and illuminates the misregistration measuring mark WMR formed on the wafer WF. The image of the illuminated mark goes by way of the projection lens LN and the mirror MY and enters into the alignment optical system SC, whereby it is imaged on the CCD camera CMY. The image of the misregistration measuring mark thus picked up by the CCD camera CMY is processed by the control device, and a measured value is memorized. The motion of the stage and the pickup of an image as well as the processing of the picked up image, are executed to each of the measuring marks in the step-and-repeat manner. When the measurement of the last mark is finished, the wafer is unloaded from the stage by means of a collection hand. After this, the wafer is processed in the same manner as the preceding embodiment. Also, the misregistrations memorized in the control device are processed in the same manner, and calibration quantities for the magnification component and the rotational component in the global alignment process as well as a calibration quantity for the process offset are inputted automatically to the stepper control device.

Referring back to FIG. 1, description will be made of a semiconductor device manufacturing system wherein automatic measurement is attainable by using an off-axis alignment mechanism, not using a reduction projection lens. Also in this type, the procedure from the first step to the third step can be conducted under the same concept as the preceding embodiment, and they are not explained here. However, it is to be noted that, for measurement of the alignment mark at the second step, a measuring mechanism having an off-axis scope may be used. On that occasion, the exposure may be conducted on the basis of the global alignment method.

The off-axis alignment scope OE for measuring the misregistration measuring mark at the fourth step, is held at a fixed position. The manner of picking up an image of the misregistration measuring mark by using this alignment scope OE, will be explained. Since the alignment mechanism (scope OE) is held fixed, the observation of the measuring mark is conducted only on the basis of the position control of the X-Y stage XYS on which a test wafer is placed. The scope OE comprises a light source for mark observation as well as a microscope and a CCD camera for the same purpose. The mark on the test wafer as illuminated with the light from the light source is imaged on the CCD camera, with the image being expanded by the microscope. The image data is picked up by the CCD camera, and it is processed by the control device CU, whereby the quantity of misregistration is determined. All the measured values are memorized in the control device CU. The motion of the stage and the pickup of the image as well as the processing of the picked up image, are executed with respect to each of the measuring marks of all the shot areas, in the step-and-repeat manner. When measurement of the last mark is completed, the wafer is unloaded from the stage by means of the collection hand HAR. After this, the wafer is processed in the same manner as the preceding embodiment. Also, the misregistrations memorized in the control device CU are processed in the same manner, and calibration quantities for the magnification component and the rotational component in the global alignment process as well as a calibration quantity for the process offset are inputted into the stopper automatically.

In the foregoing description, the reticle-to-wafer alignment is carried out at the second step. Particularly, in the alignment method using a TTL type scope such as shown in FIG. 10 or an off-axis scope, the quantity of stage movement is corrected on the basis of the global alignment process. However, this is not a requisition for the purpose of detecting a calibration quantity for the offset, the magnification component of the rotational component, as described hereinbefore. It is a possible alternative that the measured misregistration is memorized, and the exposure is executed without alignment or correction of the quantity of stage movement, and after the development the memorized value is compared with a value obtained by the automatic measurement. Also, there is a case wherein an error is caused in the quantity of drive even after completion of the alignment. On that occasion, if the misregistration is memorized and is compared with a value obtained by automatic measurement after the development, it is possible to reduce an error in correction of the calibration quantities for the magnification component, the rotational component and the offset. Further, the base line measurement of the off-axis scope is possible with the automatic measurement of the present invention. When the TTL type alignment mechanism without through the reticle or the off-axis type alignment mechanism described hereinbefore is used, there is no necessity of providing mark observing windows in the reticle, and therefore, it is possible to reduce the area to be occupied by the reticle pattern, for the automatic measurement.

In accordance with the present invention, as described hereinbefore, in a semiconductor device manufacturing system, an automatic measuring mechanism for the wafer positional deviation is constituted by a stepper (exposure apparatus) and peripheral apparatuses including a coater and a developer. This ensures enhanced measurement precision and reduced inspection time, as compared with the wafer inspection procedure having been made manually by an operator. Additionally, this ensures enhanced stability of inspection conditions or inspection precision. Namely, this assures enhanced efficiency of semiconductor device manufacture. Further, the enhancement of the process offset measurement assures higher-precision alignment in the manufacture of semiconductor devices by the stepper. As a result, the yield of semiconductor device manufacture can be improved.

While the invention has been described with reference to the structures disclosed herein, it is not confined to the details set forth and this application is intended to cover such modifications or changes as may come within the purposes of the improvements or the scope of the following claims.

What is claimed is:

1. A semiconductor device manufacturing system comprising:
   (a) a resist coating unit for applying a photoresist to a wafer having different shot areas in each of which an alignment mark and a deviation measuring mark are formed;
   (b) an exposure unit for exposing the photoresist in each shot area of the wafer to an exposure beam passed through a reticle having a deviation measuring mark, said exposure unit including:
   (b-1) a detector for detecting, with respect to each shot area, a positional error of the wafer to the reticle by using said alignment mark;
   (b-2) a stage for adjusting the positional relationship between the reticle and the wafer on the basis of the detection by said detector, to thereby align each shot area of the wafer with respect to the reticle;
   (b-3) an exposure system for exposing the wafer to the exposure beam passed through the reticle, to thereby print said deviation measuring mark of the reticle to the photoresist on each shot area of the wafer;
   (c) a developing unit for developing the photoresist of the wafer, having been exposed by said exposure unit;
   (d) a conveying unit for conveying the wafer, having been developed with said developing unit, again into said exposure unit; and
   (e) a control unit for controlling said resist coating unit, said exposure unit, said developing unit and said conveying unit in an on-line control manner, said control unit being operable so that, after the wafer is conveyed from said developing unit again into said exposure unit by said conveying unit, said detector is caused to detect, with respect to each shot area, a deviation between said deviation measuring mark of the wafer and said deviation measuring mark of the reticle as photoprinted on the photoresist of the wafer, and said control unit further being operable to calculate, on the basis of the measured deviation, a precision of alignment between the reticle and the wafer based on at least one of said alignment mark and an offset in the alignment between the reticle and the wafer based on said alignment mark.

2. A system according to claim 1, wherein a calibration mark is formed on the reticle, wherein said calibration mark includes a portion corresponding to said deviation measuring mark of the wafer and a portion corresponding to said deviation measuring mark of the reticle, and wherein said calibration mark is so configured that a deviation between the portion corresponding to said wafer mark and the portion corresponding to said reticle mark can be detected by said detector as a predetermined quantity.

3. A system according to claim 2, wherein the quantity of said calibration mark to be detected by said detector is set to be equal to zero.

4. A reduction projection exposure apparatus, comprising:
   a reduction projection lens;
   a reticle stage for holding a reticle having an alignment mark and a deviation measuring mark;
   a wafer stage for holding a wafer having different shot areas in each of which an alignment mark and a deviation measuring mark is formed;
   image pickup means for taking superposed images of said alignment mark of the reticle and said alignment mark of each shot area of the wafer, through said reduction projection lens;
   exposure means for printing said deviation measuring mark of the reticle on the wafer through said reduction projection lens;
   moving means for changing a positional relationship between the reticle held by said reticle stage and the wafer held by said wafer stage, said moving means being operable to control said positional relationship on the basis of the imagewise data obtained by said image pickup means in relation to each shot area, when said deviation measuring mark of the reticle is printed on each shot area by said exposure means while successively aligning each shot area to the reticle; and
   control means operable to cause said image pickup means to pick-up an image of said deviation measuring mark of each shot area of the wafer and said deviation measuring mark of the reticle as printed on the wafer, said control means further being operable to calculate, on the basis of the imagewise data obtained by the image pickup, a precision of alignment between the reticle and the wafer based on at least one of said alignment mark of the reticle and said alignment mark of the wafer and an offset of the reticle to wafer alignment.

5. A method manufacturing semiconductor devices by using an exposure apparatus, said method comprising the steps of:
   placing, in the exposure apparatus, a reticle having a first deviation measurement mark;
   placing, in the exposure apparatus, a wafer having a second deviation measurement mark and an alignment mark;
   photoelectrically detecting the alignment mark of the wafer to determine an alignment error of the wafer with respect to the reticle;
   adjusting the positional relationship between the reticle and the wafer on the basis of said determination, to thereby align the reticle and the wafer with each other;
   exposing the wafer with light passing through the reticle to thereby print the first deviation measurement mark of the reticle on a photoresist of the wafer;

developing the photoresist of the wafer;

placing the photoresist-developed wafer in the exposure apparatus;

detecting deviation between the second deviation measurement mark of the wafer and the first deviation measurement mark of the reticle, as printed on the photoresist of the wafer; and controlling the operation of the exposure apparatus on the basis of the detected deviation, for manufacturing semiconductor devices.

6. A method according to claim 5, wherein the exposure apparatus comprises a step-by-repeat type exposure apparatus, and wherein the wafer has different zones each including the second deviation measurement mark and the alignment mark.

7. A method according to claim 6, further comprising using the detected deviation to determine at least one of precision and offset of the alignment of the reticle and the wafer.

8. A method according to claim 5, wherein the reticle also includes a calibration mark which comprises a first portion corresponding to the first deviation measurement mark of the reticle and a second portion corresponding to the second deviation measurement mark of the wafer, and wherein the calibration mark is so formed to provide the first and second portions with a mutual deviation having a predetermined detectable amount.

* * * * *

UNITED STATES PATENT AND TRADEMARK OFFICE
CERTIFICATE OF CORRECTION

PATENT NO. : 5,249,016
DATED : September 28, 1993
INVENTOR(S) : HIROSHI TANAKA

It is certified that error appears in the above-indentified patent and that said Letters Patent is hereby corrected as shown below:

ON THE COVER PAGE

Under "U.S. PATENT DOCUMENTS"

"Nakaowatari et al." should read --Nakanowatari et al.--.

COLUMN 1

Line 65, "as" should read --an--.

COLUMN 2

Line 35, "coat" should read --to coat--.

COLUMN 4

Line 67, "of" (both occurrences) should be deleted.

UNITED STATES PATENT AND TRADEMARK OFFICE
CERTIFICATE OF CORRECTION

PATENT NO. : 5,249,016
DATED : September 28, 1993
INVENTOR(S) : HIROSHI TANAKA

It is certified that error appears in the above-indentified patent and that said Letters Patent is hereby corrected as shown below:

COLUMN 5

Line 66, "operation and the repeated" should read --and the repeated operation--; and
Line 67, "exposure" should read --exposures--.

COLUMN 9

Figure 5:
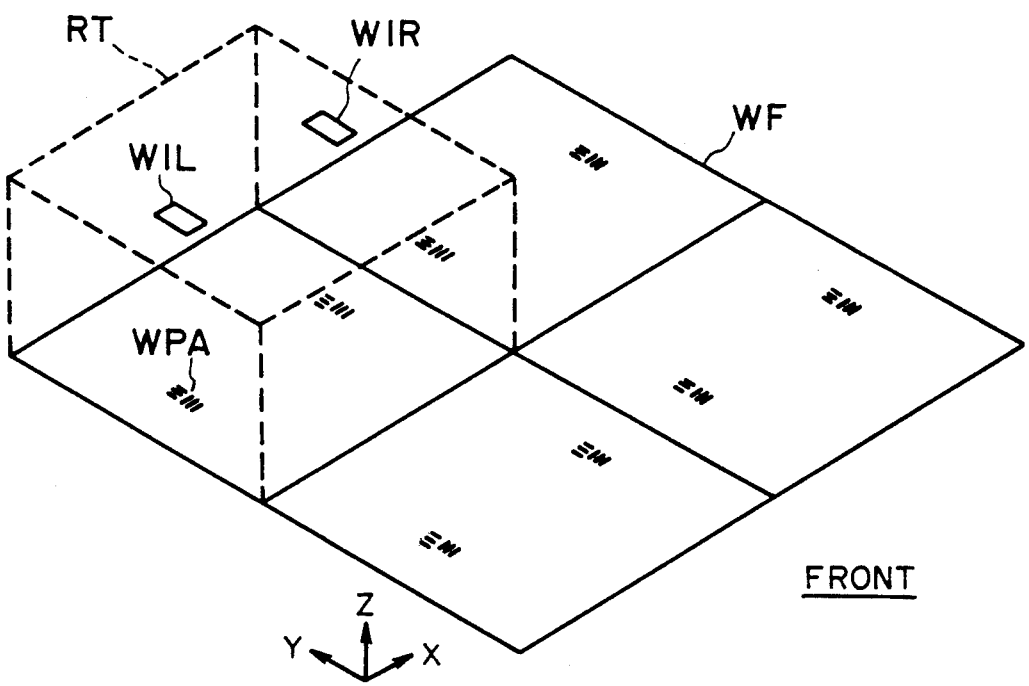
FIG. 5 is a schematic view, illustrating a positional relationship between a reticle and a wafer upon measurement of misregistration measuring marks in the system of FIG. 1.
Figure 8:
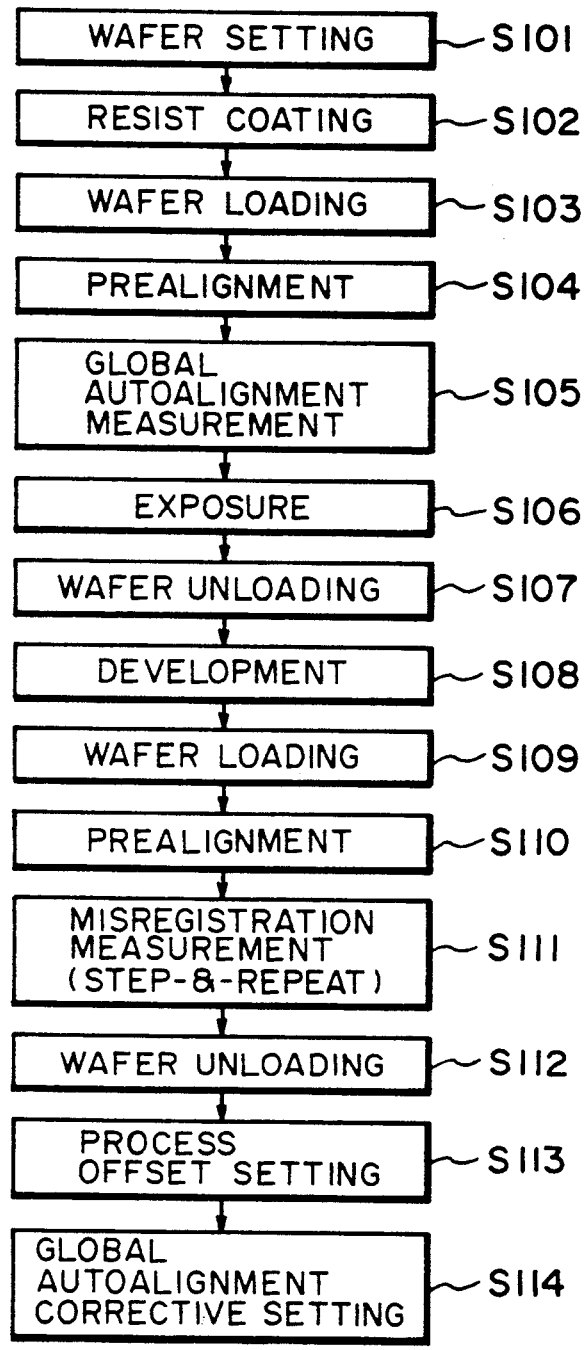
FIG. 8 is a flow chart, illustrating the sequence of automatic measurement in a global alignment mode, in the system of FIG. 1.

Line 23, "FIG. 5," should read --FIG. 8,--; and
Line 46, "(S106)." should read --(S108).--.

COLUMN 10

Line 17, "that:" should read --that--;
Line 27, "possible-to" should read --possible to--; and
Line 44, "sero" should read --zero--.

UNITED STATES PATENT AND TRADEMARK OFFICE
CERTIFICATE OF CORRECTION

PATENT NO.   : 5,249,016
DATED        : September 28, 1993
INVENTOR(S)  : HIROSHI TANAKA It is certified that error appears in the above-indentified patent and that said Letters Patent is hereby corrected as shown below:

COLUMN 12

Line 37, "stopper" should read --stepper--.

COLUMN 15

Line 15, "step-by-repeat" should read --step-and-repeat--.

Signed and Sealed this

Twenty-sixth Day of April, 1994

Attest:

BRUCE LEHMAN

Attesting Officer     Commissioner of Patents and Trademarks